US009755608B1

(12) United States Patent
Abdo

(10) Patent No.: US 9,755,608 B1
(45) Date of Patent: Sep. 5, 2017

(54) GENERATING SQUEEZED STATES OF THE MICROWAVE FIELD LEFT-HANDED TRANSMISSION LINE RESONATOR

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/336,935

(22) Filed: Oct. 28, 2016

(51) Int. Cl.
*H03H 7/01* (2006.01)
*H03H 3/00* (2006.01)

(52) U.S. Cl.
CPC ............ *H03H 7/0115* (2013.01); *H03H 3/00* (2013.01)

(58) Field of Classification Search
None
See application file for complete search history.

(56) References Cited

U.S. PATENT DOCUMENTS

| 4,984,298 | A | 1/1991 | Slusher et al. | |
|---|---|---|---|---|
| 7,135,917 | B2 | 11/2006 | Kozyrev et al. | |
| 7,508,283 | B2* | 3/2009 | Itoh | H01P 5/227 333/109 |
| 7,839,236 | B2* | 11/2010 | Dupuy | H01P 1/20363 333/136 |
| 8,054,073 | B2 | 11/2011 | Tuchman | |
| 8,232,853 | B2* | 7/2012 | Ryou | H01P 3/081 333/185 |
| 8,729,980 | B2* | 5/2014 | Kim | H01P 1/203 333/126 |
| 8,749,323 | B2* | 6/2014 | Jung | H01P 1/2039 29/846 |
| 8,878,626 | B2 | 11/2014 | Zmuidzinas et al. | |
| 8,947,317 | B2* | 2/2015 | Ueda | H01P 1/203 333/32 |
| 9,054,406 | B2* | 6/2015 | Ueda | H01P 1/32 |
| 2016/0018269 | A1 | 1/2016 | Maurer et al. | |
| 2017/0091647 | A1* | 3/2017 | Abdo | G01V 8/005 |
| 2017/0091648 | A1* | 3/2017 | Abdo | G06N 99/002 |
| 2017/0093381 | A1* | 3/2017 | Abdo | H01L 39/025 |

OTHER PUBLICATIONS

Castellanos-Beltran et al., "Amplification and squeezing of quantum noise with a tunable Josephson metamaterial," arXiv preprint arXiv:0806.0659, 2008, pp. 1-13.
(Continued)

*Primary Examiner* — Dean Takaoka
*Assistant Examiner* — Alan Wong
(74) *Attorney, Agent, or Firm* — Cantor Colburn LLP; Vazken Alexanian

(57) ABSTRACT

A technique relates to a superconducting microwave device. A left-handed resonator include at least one unit cell. A non-linear dispersive medium is connected to the left-handed resonator, such that one end of the left-handed resonator is connected to the non-linear dispersive medium and an opposite end of the left-handed resonator is connected to a port. The left-handed resonator and the non-linear dispersive medium are configured to output a quantum signal in a squeezed state.

25 Claims, 9 Drawing Sheets

(56) References Cited

OTHER PUBLICATIONS

M. Hatridge et al., "Dispersive magnetometry with a quantum limited SQUID parametric amplifier," Physical Review B, vol. 83, No. 13, 2011, 134501, pp. 1-8.
R. Vijay et al., "Invited review article: the Josephson bifurcation amplifier," Review of Scientific Instruments, vol. 80, No. 11, 111101, 2009, pp. 1-17.
Siddiqi et al., "RF-Driven Josephson Bifurcation Amplifier for Quantum Measurement," Physical Review Letters, vol. 93, No. 20, 207002, Nov. 12, 2004, pp. 1-4.
Yurke et al., "Observation of 4.2-K Equilibrium-Noise Squeezing via a Josephson-Parametric Amplifier," Physical Review Letters, vol. 60, No. 9, Feb. 29, 1988, pp. 1-4.
Yurke et al., "Observation of parametric amplification and deamplification in a Josephson parametric amplifier," Physical Review A, vol. 39, No. 5, Mar. 1, 1989, pp. 1-17.

\* cited by examiner

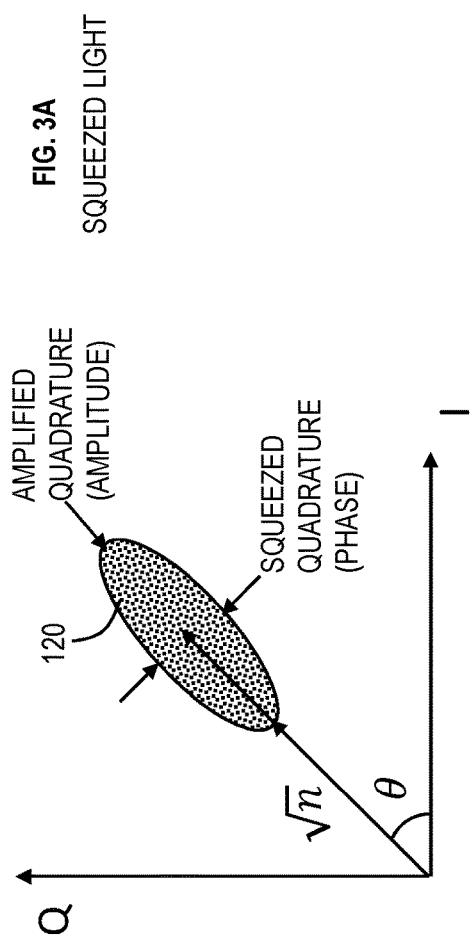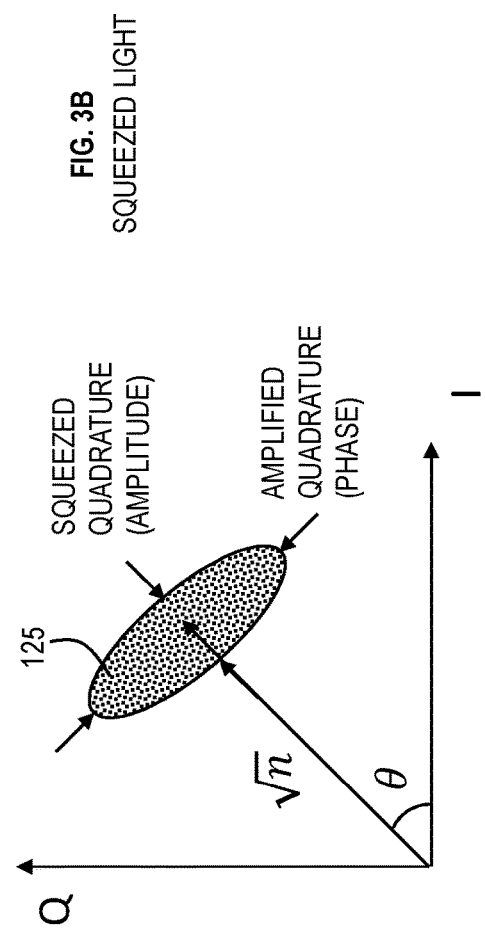

FIG. 7 700

PROVIDE A LEFT-HANDED RESONATOR INCLUDING AT LEAST ONE UNIT CELL 705

PROVIDE A NON-LINEAR DISPERSIVE MEDIUM CONNECTED TO THE LEFT-HANDED RESONATOR, SUCH THAT ONE END OF THE LEFT-HANDED RESONATOR IS CONNECTED TO THE NON-LINEAR DISPERSIVE MEDIUM AND AN OPPOSITE END OF THE LEFT-HANDED RESONATOR IS CONNECTED TO A PORT, WHEREIN THE LEFT-HANDED RESONATOR AND THE NON-LINEAR DISPERSIVE MEDIUM ARE CONFIGURED TO OUTPUT A QUANTUM SIGNAL IN A SQUEEZED STATE 710

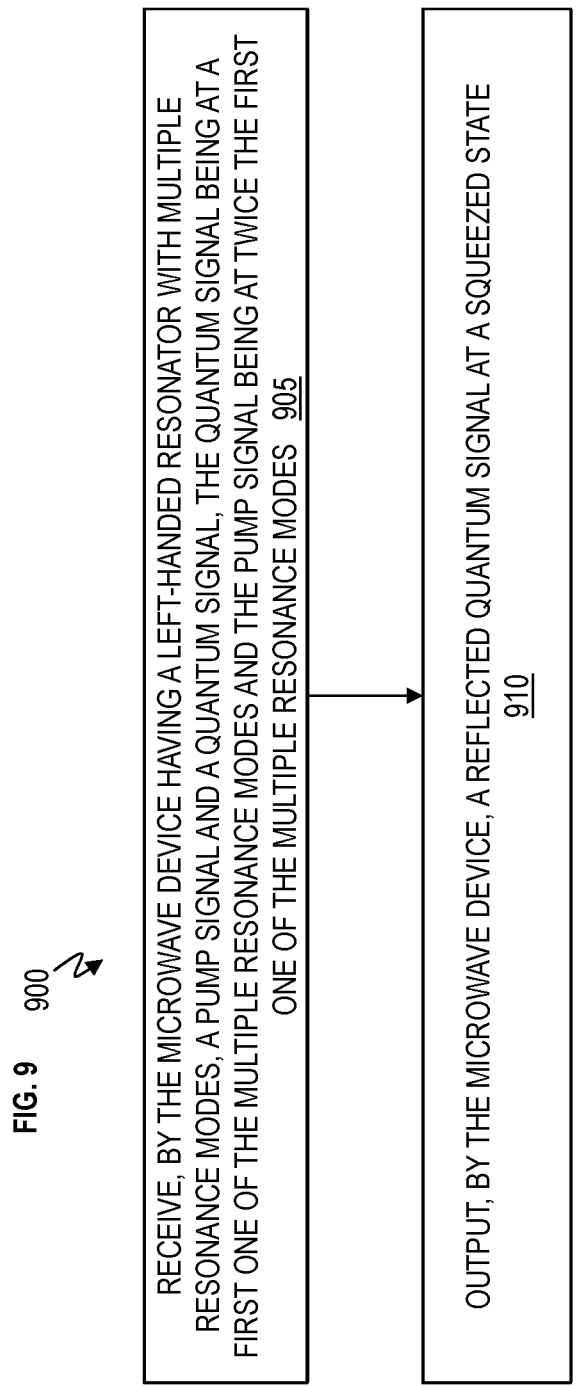

GENERATING SQUEEZED STATES OF THE MICROWAVE FIELD LEFT-HANDED TRANSMISSION LINE RESONATOR

BACKGROUND

The present invention relates to superconducting electronic devices, and more specifically, to generating squeezed states of the microwave field in a superconducting left-handed transmission line resonator.

Light can be squeezed. Particularly, it is the quantum noise of light that can be squeezed. Such squeezed light, which is a squeezed state of light, is a special form of light that is researched in the field of quantum optics. The quantum noise of light is a direct consequence of the existence of photons, which are the smallest energy quanta of light. When light is detected with an ideal photo diode, every photon is translated into a photo-electron. For squeezed light, the resulting photo-current exhibits surprisingly low noise. The noise is lower than the minimum noise one expects from the existence of independent photons and their statistical arrival times. The quantum noise of light with independent (uncorrelated) photons is often called shot-noise. The light itself is then in a so-called coherent state, or Glauber state. Shot-noise could be expected as the minimum noise possible. However, squeezed light can even show less noise than Glauber states. Squeezed states of light belong to the class of non-classical states of light.

SUMMARY

According to one or more embodiments, a microwave device is provided. The microwave device includes a left-handed resonator including at least one unit cell, and a non-linear dispersive medium connected to the left-handed resonator, such that one end of the left-handed resonator is connected to the non-linear dispersive medium and an opposite end of the left-handed resonator is connected to a port. The left-handed resonator and the non-linear dispersive medium are configured to output a quantum signal in a squeezed state.

According to one or more embodiments, a method of forming a microwave device is provided. The method includes providing a left-handed resonator including at least one unit cell and providing a non-linear dispersive medium connected to the left-handed resonator, such that one end of the left-handed resonator is connected to the non-linear dispersive medium and an opposite end of the left-handed resonator is connected to a port. The left-handed resonator and the non-linear dispersive medium are configured to output a quantum signal in a squeezed state.

According to one or more embodiments, a method for generating squeezed states using a microwave device is provided. The method includes receiving, by the microwave device having a left-handed resonator with multiple resonance modes, a pump signal and a quantum signal. The pump signal and the quantum signal are at a first one of the multiple resonance modes. Also, the method includes outputting, by the microwave device, a reflected quantum signal in a squeezed state.

According to one or more embodiments, a method for generating squeezed states using a microwave device is provided. The method includes receiving, by the microwave device having a left-handed resonator with multiple resonance modes, a pump signal and a quantum signal. The quantum signal is at a first one of the multiple resonance modes and the pump signal is at twice the first one of the multiple resonance modes. Also, the method includes outputting, by the microwave device, a reflected quantum signal in a squeezed state.

BRIEF DESCRIPTION OF THE DRAWINGS

FIG. 3A is an example of squeezed light in the I-Q plane.

FIG. 3B is an example of squeezed light in the I-Q plane.

FIG. 7 is a flow chart of a method of forming a microwave device according to one or more embodiments.

FIG. 9 is a flow chart of a method for generating squeezed states using a microwave device according to one or more embodiments.

DETAILED DESCRIPTION

Figure 1:
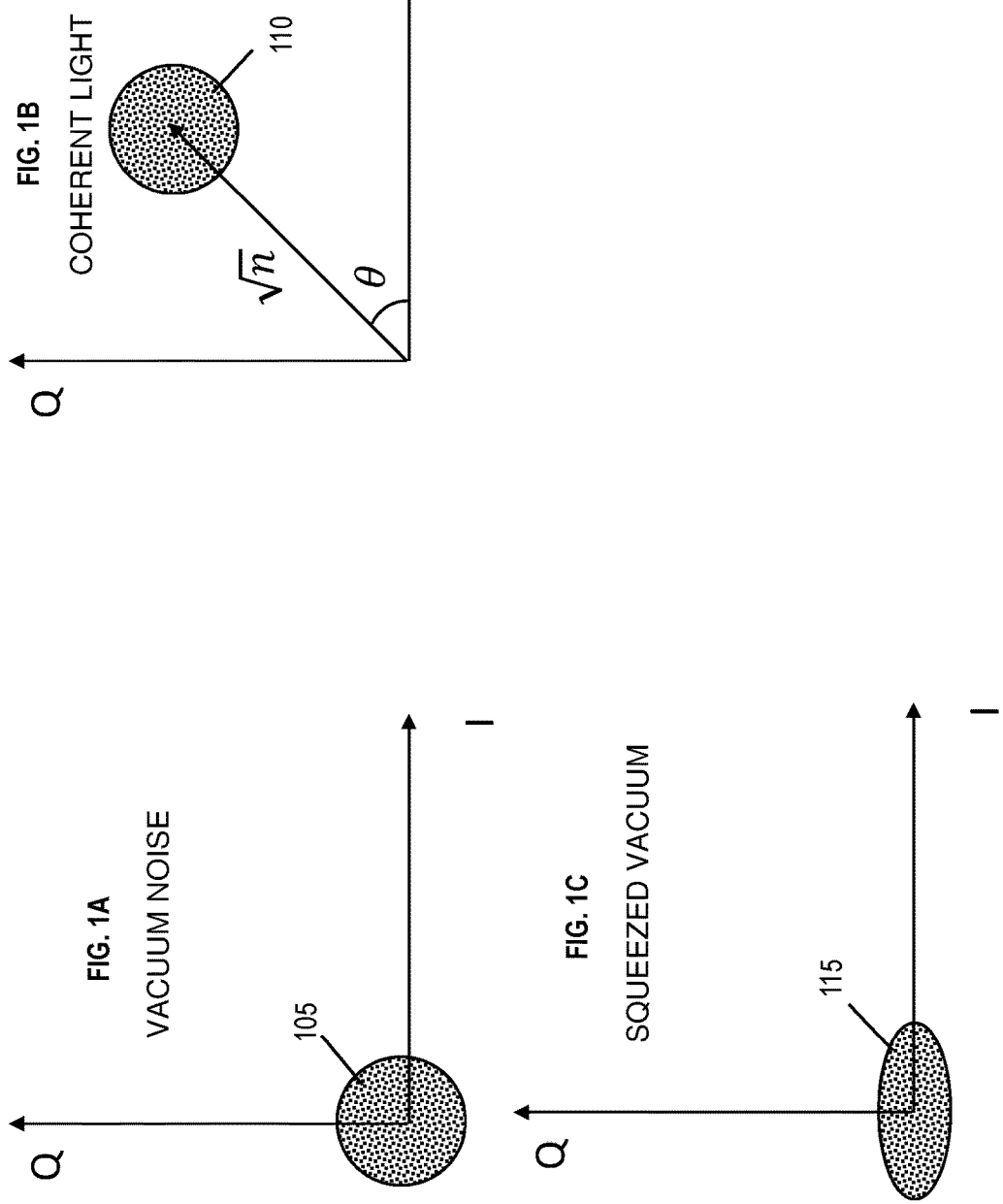
FIG. 1A is an example of vacuum state noise in the I-Q plane.
FIG. 1B is an example of coherent state noise in the I-Q plane.
FIG. 1C is an example of squeezed vacuum noise in the I-Q plane.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Squeezed light is a special state of the electromagnetic field in which the quantum noise variance of one quadrature of the field (e.g., amplitude or phase) is below the standard quantum limit (SQL) (set by the Heisenberg uncertainty principle), while the quantum noise variance of the other orthogonal quadrature (e.g., amplitude or phase) exceeds the SQL. Such non-classical states of light can find applications in various areas of physics, such as 1) enhancement of the measurement precision of physical quantities that can be probed using light, 2) enhancement of the quality and resolution of quantum imaging, 3) suppression of the radiative decay of atomic coherence by squeezing the vacuum noise (which is experienced by the atom), and 4) enhancement of the fidelity of certain microwave quantum gates.

One or more embodiments include a microwave device having a left-handed transmission line resonator coupled to a dispersive non-linear medium at an anti-node position of the rf-current of the different eigenmodes of the microwave device. The microwave device can be either directly connected to a feedline or capacitively coupled to a feedline. The pump tones can be either injected using the same port as the quantum signal or through an on-chip flux line inductively coupled to direct current (DC) superconducting quantum interference devices (SQUIDs) which form the non-linear dispersive medium of the microwave device. The frequency of the pump tone can be set to either the resonance frequency of the eigenmode of the microwave device which is used in the generation of the squeezed states of the vacuum or at twice this resonance frequency for the case where the pump is injected through an on-chip flux line. The microwave device provides the capability to generate on-demand squeezed states at different frequencies using the same microwave device immediately without relying on a flux-tunable resonance frequency of the device.

FIGS. 1A, 1B, 1C, 3A, and 3B depict examples of vacuum state of light, coherent state of light, and squeezed state of light (vacuum and coherent) in the I-Q plane (where I and Q represent two orthogonal quadratures of the electromagnetic field). The Q axis represents one quadrature or a quadrature component, and the I axis represents another quadrature orthogonal to the Q axis (i.e., another quadrature component). It is noted that in this picture of IQ plane, the center of the disk/circle or ellipse representing the state of light, represents the average I and Q components of the light state, while the width of the disk/circle of ellipse around the center represents the standard deviation of the noise associated with that state.

FIG. 1A is an example of vacuum state noise in the I-Q plane. The product of the uncertainty in I quadrature (standard deviation of I) and the uncertainty in Q quadrature (standard deviation of Q) results in the uncertainty relation 105 for the vacuum state, which equals to the minimum amount allowed by quantum mechanics (called the standard quantum limit SQL).

FIG. 1B is an example of coherent state noise in the I-Q plane. The product of the uncertainty in the I and Q quadrature components illustrates the uncertainty relation 110 for coherent light which is similar to the vacuum state case. It is noted that in the IQ picture, the distance of the center of the disk/ellipse from the origin represents the amplitude of the signal $\sqrt{I_c^2+Q_c^2}$ where $(I_c, Q_c)$ represent the coordinates of the mean values of the signal in the IQ plane. Alternatively, the amplitude of the signal can be expressed as $\sqrt{n}$, where n is average number of photons in the coherent light, and $\theta=\tan(Q_c/I_c)$ represents the phase of the coherent light.

FIG. 1C is an example of squeezed vacuum state in the I-Q plane. The product of the uncertainty of I and Q quadrature components illustrates the uncertainty relation 115 for squeezed vacuum state which equals the minimum amount allowed by quantum mechanics (SQL) similar to the vacuum state of FIG. 1A. The main difference between the squeezed vacuum FIG. 1C and vacuum state FIG. 1A is that in the vacuum state the uncertainty in both quadratures is equal, whereas in the squeezed vacuum the uncertainty in one quadrature (e.g., Q) is smaller (squeezed quadrature) than the uncertainty in the orthogonal inflated quadrature (e.g., I). In this example, the noise in the Q quadrature is reduced below the vacuum level.

FIG. 3A is an example of squeezed light in the I-Q plane. The product of the uncertainty of I and Q quadrature components illustrates the uncertainty relation 120 for squeezed coherent light in which the noise (uncertainty) in the phase quadrature of the signal is squeezed while the noise (uncertainty) in the amplitude quadrature of the signal is increased.

FIG. 3B is an example of squeezed light in the I-Q plane. The product of the uncertainty of I and Q quadrature components illustrates the uncertainty relation 125 for squeezed light in which the noise (uncertainty) in the amplitude is squeezed while the noise (uncertainty) in the phase quadrature is increased.

Figure 2:
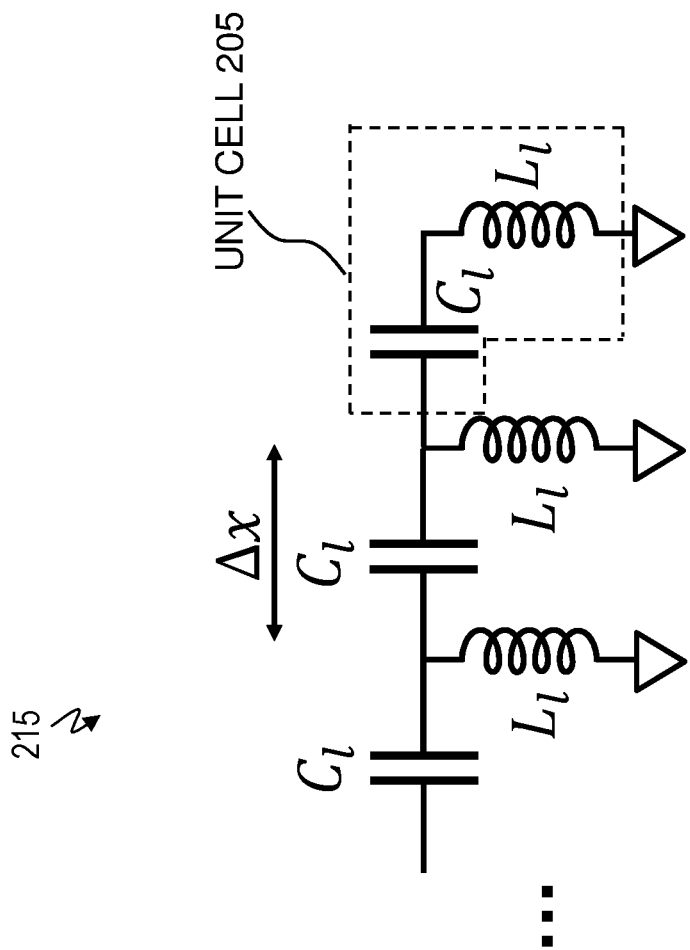
FIG. 2 is a circuit of a semi-infinite lossless left-handed transmission line utilized in a microwave device for generating squeezed light states according to one or more embodiments.

Turning now to aspects of the present invention, FIG. 2 is a circuit of a superconducting semi-infinite lossless left-handed transmission line resonator 215 which can be utilized in the construction of a microwave device 400 (discussed below) for generating squeezed light states according to one or more embodiments.

The unit cell 205 includes a capacitor $C_l$ connected to inductor $L_l$ where "l" represent left-handed transmission line. The other end of the inductor $L_l$ is connected to ground. The unit cell 205 is connected to another unit cell, which is connected to another unit cell, and so forth. The unit cell 205 is repeated N amount of times for the microwave device 400.

The dispersion relation of a left-handed transmission line reads $$\omega_l(k_l) = \frac{1}{2\sqrt{L_l C_l} \sin\left(\frac{k_l \Delta x}{2}\right)}$$

where $\Delta x$ is the size of the unit cell, and $k_l$ is the wave vector. The dispersion relation means that the resonance modes of the left-handed transmission line are not equally dispersed or spaced in the frequency domain.

The phase and group velocity of the left-handed transmission line have opposite orientation $$\frac{\partial \omega_l(k)}{\partial k} < 0,$$

where k is $k_l$. This means that the wave propagates in one direction while the energy propagates in the other direction. One consequence of this relation is that in left-handed transmission lines low-frequencies correspond to short wavelengths. In contrast, in right-handed transmission lines where the dispersion relation increases with the wave vector, low-frequencies correspond to long wavelengths.

The characteristic impedance of the left-handed transmission line is $$Z_l = \sqrt{\frac{L_l}{C_l}}$$

for each unit cell.

Low-frequency bound of the left-handed transmission line is $$\omega_{1R} = \frac{1}{2\sqrt{L_l C_l}}.$$

The low-frequency bound is the lowest resonance frequency of the left-handed transmission line resonator 215, and the other resonance modes such as the second, third, fourth, and so forth are above (greater than) the low-frequency bound.

Figure 4:
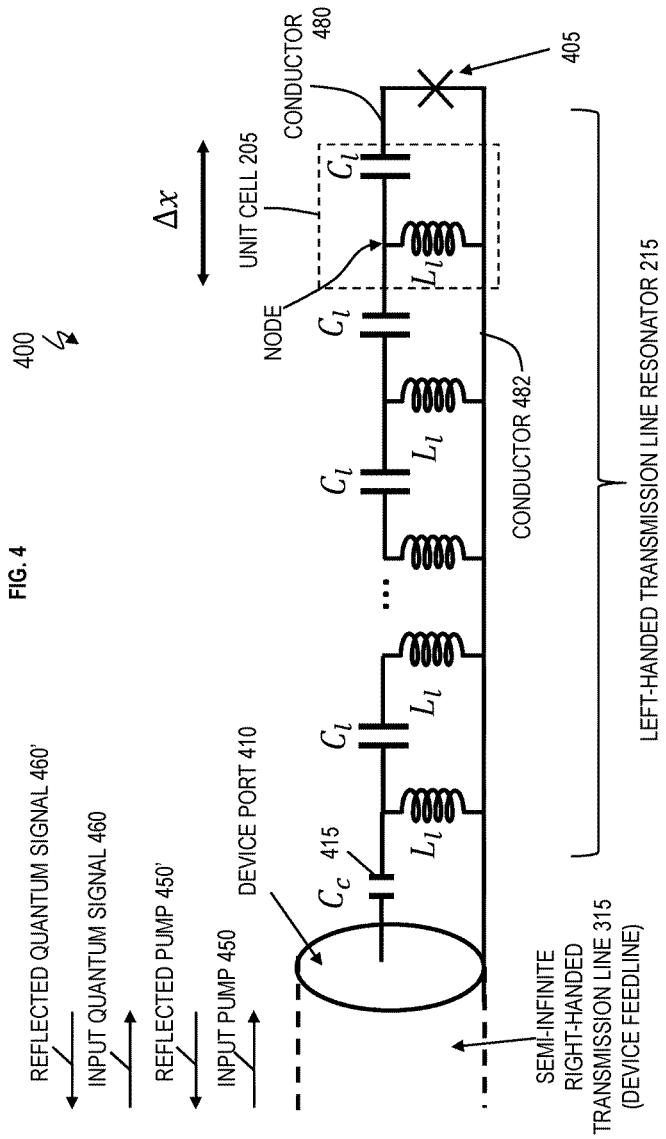
FIG. 4 is a schematic of a circuit for the microwave device generating squeezed light states according to one or more embodiments.

FIG. 4 is a schematic of a circuit for the superconducting microwave device 400 according to one or more embodiments. The microwave device 400 includes the left-handed transmission line resonator 215 connected to a non-linear dispersive medium 405. In one implementation, the non-linear dispersive medium 405 can be a Josephson junction (JJ) or an array of Josephson junctions (JJs). The microwave device 400 includes one or more unit cells 205 connected together in series.

The opposite end of the left-handed transmission line resonator 215 is connected to a device port 410. The left-handed transmission line resonator 215 can be coupled to the device port 410 via a coupling capacitor 415. In one implementation, the device port 410 can be a hybrid coupler, such as a 90° or 180° hybrid coupler.

The device port 410 can be connected to a device feedline. The device feedline can be the semi-infinite right-handed transmission line 315. The right-handed transmission line 315 can be implemented as coaxial cable having a center conductor and an outer conductor, microstrips, striplines, etc. The left-handed transmission line resonator 215 built out of discrete unit cells and realized using lumped elements as illustrated in FIG. 2

The microwave device 400 and/or left-handed transmission line resonator 215 is a multimode resonator with multiple resonance modes, i.e., a high density of resonance modes, at the frequency range of interest (e.g., 3-20 GHz). The rf-currents associated with the resonance modes of the multimode resonator are maximum at the location of JJs 405. Hence, the JJs couple strongly to the different resonance modes. In other words, the left-handed transmission line resonator 215 can have multiple resonance modes.

Now discussion turns to the operation of the microwave device 400. A microwave pump signal 450 is input at resonance via the device port 410. As discussed herein, the left-handed transmission line resonator 215 has a high density of resonance modes at the microwave frequency range of interest, and the microwave pump signal 450 is input at one of these resonance modes. Concurrently or nearly concurrently, a quantum signal 460 is input at a microwave frequency via the device port 410. The quantum signal 460 is input at the same or nearly the same frequency as the microwave pump signal 450. The quantum signal 460 is the signal/light that is to be squeezed.

The microwave pump signal 450 is strongly coupled to the non-linear dispersive medium 405, which is a JJ or array of JJs in this example. The microwave pump signal 450 and the quantum signal 460 propagate/travel through the unit cells 205 and interact with the non-linear dispersive medium 405. The pump signal 450 causes the quantum signal 460 to be squeezed. The quantum signal 460 is squeezed in one of the quadratures and amplified in the other quadrature according to a phase difference between the input microwave pump signal 450 and the input microwave quantum signal 460. As such, the reflected quantum signal 460' exhibits the squeezed state. The reflected quantum signal 460' is reflected at the microwave frequency of the input quantum signal 460 (the same as the input pump signal 450 in the implementation), which corresponds to one of the resonance modes of the left-handed transmission line resonator 215. Assume that in the microwave frequency of interest the left-handed transmission line resonator 215 has resonance frequencies/modes at $f_1, f_2, f_3, \ldots f_N$ where N is the last of the resonance mode for the left-handed resonator 215. For example, the pump signal 450 and quantum signal 460 are input at the frequency $f_1$ (e.g., 4 GHz), and the reflected quantum signal 460' is squeezed according to the phase difference between the pump signal 450 and quantum signal 460. The reflected quantum signal 460' is output at the frequency $f_1$ (e.g., 4 GHz). By analogy, the same microwave device 400 can be utilized to squeeze the quantum signal 460 at frequency $f_2$ (e.g., 4.5 GHz), by applying both the pump signal 450 and the quantum signal 460 at frequency $f_2$ (e.g., 4.5 GHz), thereby resulting in the reflected quantum signal 460' that has been squeezed. Continuing through the frequency $f_N$ (e.g., 8.2 GHz), the same microwave device 400 can be utilized to squeeze quantum signal 460 at frequency $f_N$ (e.g., 8.2 GHz), by applying both the pump signal 450 and the quantum signal 460 at frequency $f_N$ (e.g., 8.2 GHz), thereby resulting in the reflected quantum signal 460' (at frequency $f_N$) that has been squeezed. It should be appreciated that microwave device 400 is configured to generate squeezed states at resonance frequencies/modes $f_1, f_2, f_3, \ldots f_N$ (using a matching pump and quantum frequency) without having the need to tune the resonance frequency of the left-handed transmission line resonator 215. That is, without having to adjust the left-handed transmission line resonator 215 to work for a different resonance mode because the left-handed transmission line resonator 215 has, for example, 20 resonance modes within the microwave frequency range of interest (e.g., 4-20 GHz).

For completeness, it is noted that the reflected pump signal 450' is also reflected back out the device port 410. The microwave device 400 including the capacitors (with the exception of the dielectric material in the capacitors), transmission lines/conductors 480, 482, Josephson junctions/DC SQUIDs (with the exception of the thin insulating material), and resonators 215, 315 are made of superconducting material. Additionally, the port 410 and/or flux line 605 (discussed below) are made of low-loss normal metals or can be made of superconducting material. Examples of superconducting materials (at low temperatures, such as about 10-100 millikelvin (mK), or about 4 K) include niobium, aluminum, tantalum, etc.

When the input quantum signal 460 is in phase with the input pump signal 450, this causes the reflected quantum signal 460' to be amplified (both the signal and the noise in this quadrature). However, when the input quantum signal 460 is 90° out of phase (orthogonal) with the input pump signal 450, this causes the reflected quantum signal 460' to be squeezed (both the signal and the noise in this quadrature). One skilled in the art understands that designing which quadrature is squeezed and which quadrature is amplified is based on the phase difference (which can be 90° out of phase or in phase, i.e., no phase difference) between the quantum signal 460 and pump signal 450.

Figure 5:
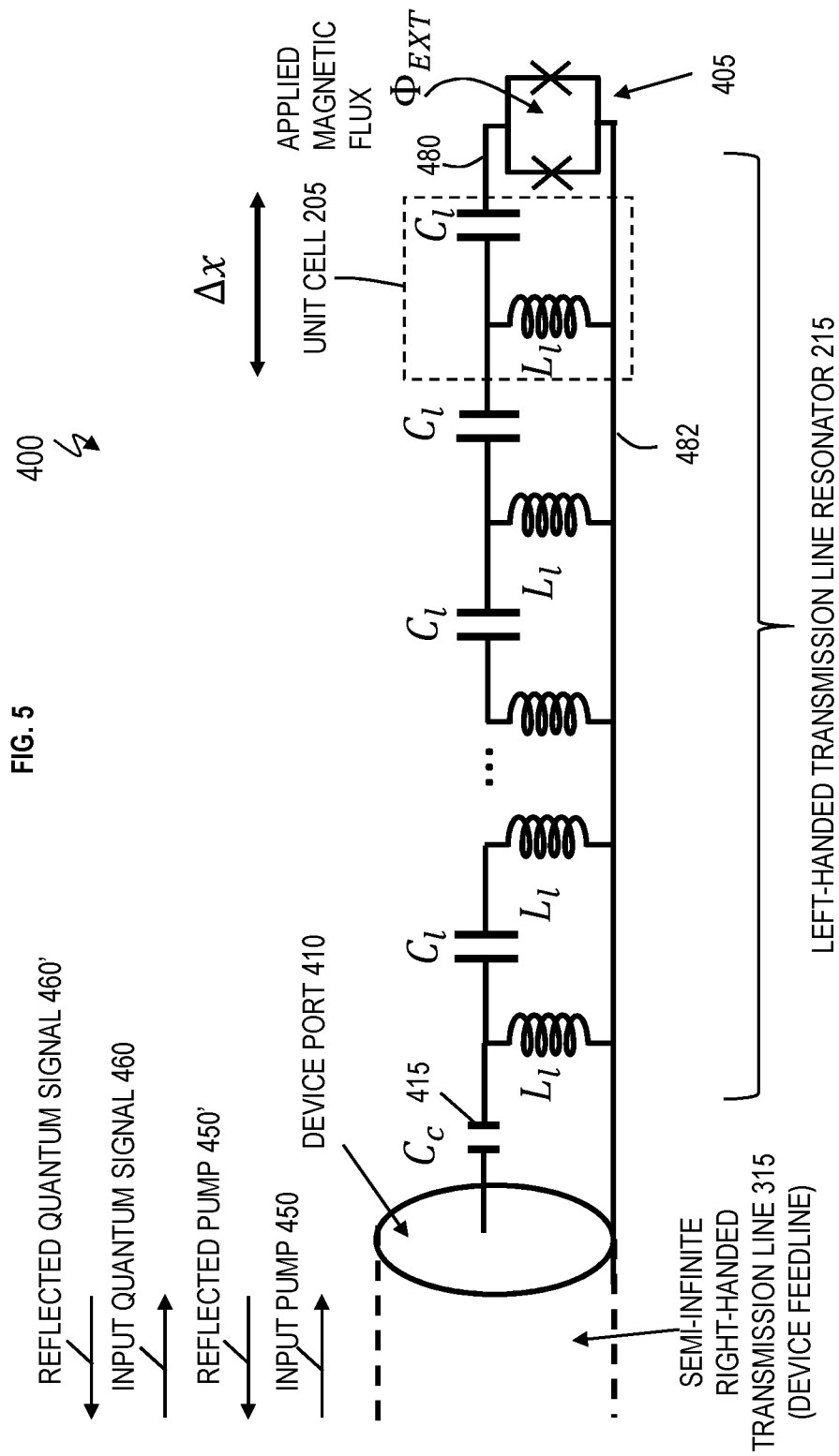
FIG. 5 is a schematic of a circuit for the microwave device generating squeezed light states according to one or more embodiments.

As a variation to the circuit in FIG. 4, FIG. 5 is a schematic of a circuit for the superconducting microwave device 400 according to one or more embodiments. The microwave device 400 includes the left-handed transmission line resonator 215 connected to the non-linear dispersive medium 405. However, in this case, the non-linear dispersive medium 405 is an array of JJs and/or a DC SQUIDs. The operation of the microwave device 400 is the same in FIGS. 4 and 5, and the operation is not repeated.

In FIG. 5, the non-linear dispersive medium 405 can be tuned by applying an external magnetic flux $\Phi_{EXT}$. The magnetic flux can be utilized to shift the resonance frequencies/modes $f_1, f_2, f_3, \ldots f_N$ up or down in a certain frequency range around $f_1, f_2, f_3, \ldots f_N$, such as, for example, a few megahertz, tens of megahertz, or one gigahertz.

In other words, if the resonance frequencies/modes $f_1, f_2, f_3, \ldots f_N$ of the left-hand transmission line resonator 215 are designed to be, for example, 5, 5.15, 5.25, 6, 6.5, 7 . . . 20 GHz when no magnetic flux is applied, the magnetic flux $\Phi_{EXT}$ can be applied to the non-linear dispersive medium 405 (e.g., DC SQUID) to shift the resonance frequencies/modes $f_1, f_2, f_3, \ldots f_N$ down by 1-100 MHz. The exact amount of frequency shift for each resonance frequency can vary depending on the effect of the inductance change of the non-linear dispersive medium 405 (e.g., DC SQUID), due to the applied flux, on the total inductance of the device for the each resonance mode.

Figure 6:
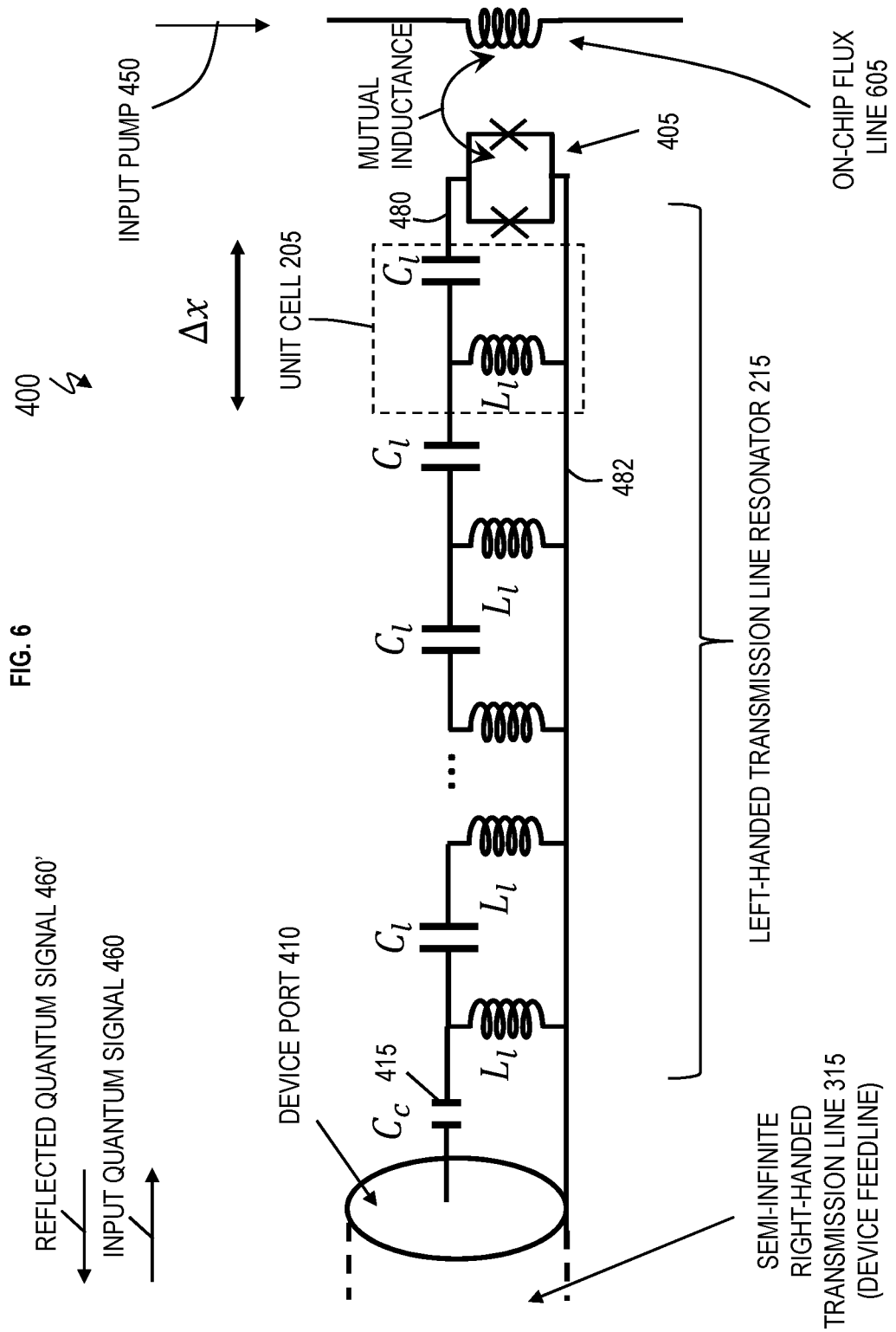
FIG. 6 is a schematic of a circuit for the microwave device generating squeezed light states according to one or more embodiments.

FIG. 6 is a schematic of the circuit for the microwave device 400 with a modification according to one or more embodiments. The microwave device 400 in FIG. 6 now includes an on-chip flux line 605. Previously, the pump signal was driven through the device port 410 in FIGS. 4 and 5, just as the quantum signal 460. However, in FIG. 6, the pump signal 450 is driven through the on-chip flux line 605 at a pump frequency $f_p$ that is twice the resonance frequency. As discussed above, the left-handed transmission line resonator 215 has the resonance frequencies/modes $f_1, f_2, f_3, \ldots f_N$, and previously both the quantum signal 460 and the pump signal 450 were input at the same (or nearly) the same the resonance frequencies/modes $f_1, f_2, f_3, \ldots f_N$ (i.e., one at a time).

However, in FIG. 6, the input pump signal 450 is transmitted on the on-chip flux line 605 to drive the non-linear dispersive medium 405 by mutual inductance, and the non-linear dispersive medium 405 is a DC-SQUID or array of DC-SQUIDs. Also, the input pump signal 450 has a frequency that is 2× the particular the resonance frequency/mode of the microwave device 400. Accordingly, for the given resonance frequency $f_1$ (e.g., 6 GHz), then the pump frequency $f_p$ is $2f_1$ (e.g., 12 Hz), and the quantum signal frequency $f_q$ is $f_1$ (e.g., 6 GHz). Accordingly, the reflected quantum signal 460' is the squeezed signal/light at the quantum signal frequency $f_q$ which is $f_1$ (e.g., 6 GHz). This is analogous for each of the resonance frequencies/modes $f_1, f_2, f_3, \ldots f_N$ such that when the pump frequency $f_p$ is $2f_2$, then the quantum signal frequency $f_q$ is $f_2$ and the reflected quantum signal 460' is also at $f_q=f_2$, through when the pump frequency $f_p$ is $2f_N$, then the quantum signal frequency $f_q$ is $f_N$ and the reflected quantum signal 460' is also at $f_q=f_N$.

FIG. 6 allows the quantum signal 460 and reflected quantum signal 460' to have their own device port 410, thus being separated from the pump signal 450. The microwave device 400 is configured to operate in reflection with respect to the quantum signal 460 and reflected quantum signal 460'. However, the microwave device 400 is configured to operate in transmission with respect to the microwave pump signal 450 because of the on-chip flux line 605, which is coupled to the non-linear dispersive medium 405 through mutual inductance.

FIG. 7 is a flow chart 700 of a method of forming a microwave device 400 according to one or more embodiments. At block 705, a left-handed resonator 215 includes at least one unit cell 205. At block 710, a non-linear dispersive medium 405 is connected to the left-handed resonator 215, such that one end of the left-handed resonator 215 is connected to the non-linear dispersive medium 405 and an opposite end of the left-handed resonator 215 is connected to a port 410. The left-handed resonator 215 and the non-linear dispersive medium 405 are configured to output a (reflected) quantum signal 460' in a squeezed state.

The at least one unit cell 205 is connected to a first conductor 480 and a second conductor 482. The first conductor 480 is connected to a first end of the non-linear dispersive medium 405 and the second conductor 482 is connected to a second end of the non-linear dispersive medium 405. The at least one unit cell 205 includes a capacitor $C_l$ and an inductor $L_l$ connected together at a node of the first conductor 480, and another end of the inductor $L_l$ is connected to the second conductor 482.

The left-handed resonator 215 is configured to have multiple resonance modes $f_1, f_2, f_3, \ldots f_N$ in the microwave range of interest and the multiple resonance modes are not equally spaced apart. The multiple resonance modes are between 4-20 GHz.

The non-linear dispersive medium 405 is a Josephson junction as represented in FIG. 4. The non-linear dispersive medium 405 is an array of Josephson junctions as represented in FIGS. 4 and 5. The non-linear dispersive medium 405 is a DC-SQUID as represented in FIGS. 5 and 6. The non-linear dispersive medium 405 is an array of DC-SQUIDs as represented in FIGS. 5 and 6.

Figure 8:
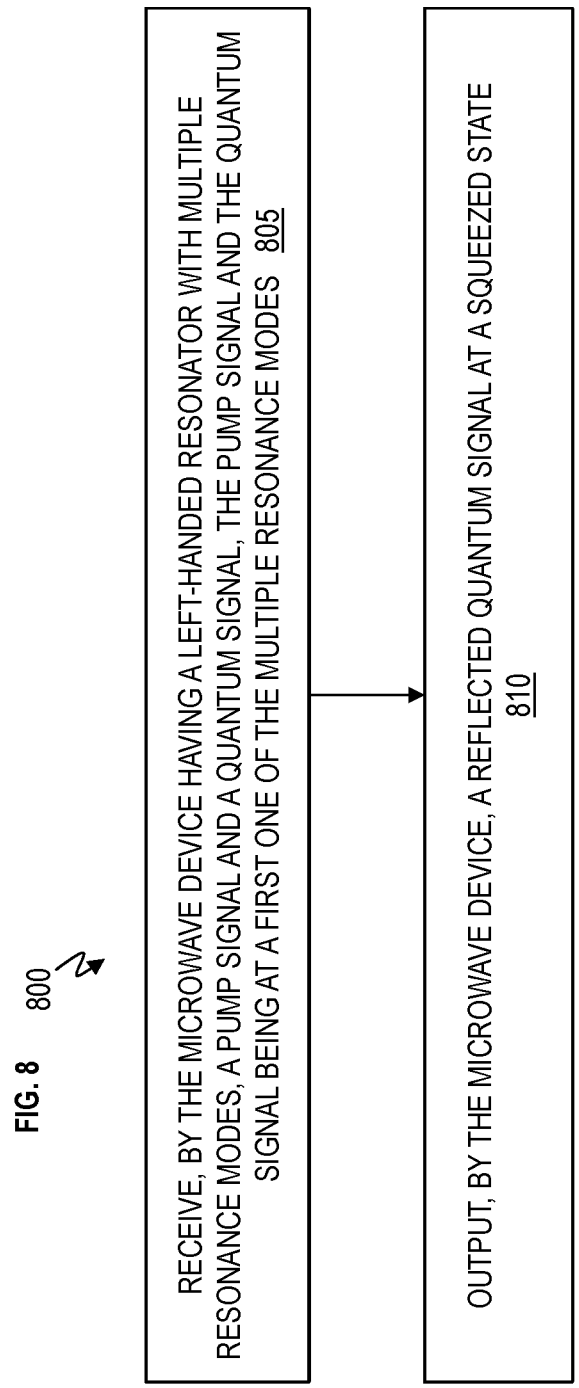
FIG. 8 is a flow chart of a method for generating squeezed states using a microwave device according to one or more embodiments.

FIG. 8 is a flow chart 800 of a method for generating squeezed states using a microwave device 400 according to one or more embodiments. At block 805, the microwave device 400 having a left-handed resonator 215 with multiple resonance modes is configured to receive a pump signal 450 and a quantum signal 460, where the pump signal 450 and the quantum signal 460 are at a first one of the multiple resonance modes (e.g., at any one of the frequencies $f_1, f_2, f_3, \ldots f_N$).

At block 810, the microwave device 400 is configured to output a reflected quantum signal 460' in a squeezed state. A few example states are depicted in FIGS. 1C, 1D, and 1E but it is understood that the quadratures I and Q can be squeezed to various degrees as understood by one skilled in the art.

The microwave device 400 is configured to receive the pump signal 450 and the quantum signal 460 at a second one of the multiple resonance modes (e.g., another one of the frequencies $f_1, f_2, f_3, \ldots f_N$) without needing to tune any of the multiple resonance modes of the left-handed resonator 215, and to output the reflected quantum signal 460' at the squeezed state. The non-linear dispersive medium 405 (of the microwave device 400) is configured to receive magnetic flux $\Phi_{EXT}$ in order to shift the multiple resonance modes of the left-handed resonator 215.

FIG. 9 is a flow chart 900 of a method for generating squeezed states using a microwave device 400 according to one or more embodiments. At block 905, the microwave device 400 having a left-handed transmission-line resonator 215 with multiple resonance modes is configured to receive a pump signal 450 and a quantum signal 460, where the quantum signal 460 is at a first one of the multiple resonance modes (e.g., at any one of the frequencies $f_1, f_2, f_3, \ldots f_N$) and the pump signal is at twice the first one of the multiple resonance modes (e.g., at 2 times the same one of the frequencies $f_1, f_2, f_3, \ldots f_N$ as the quantum signal 460). At block 910, the microwave device 400 is configured to output a reflected quantum signal 460' in a squeezed state.

The pump signal 450 is input through a flux line 605 and the quantum signal 460 is input through a port 410 connected to the microwave device 400, as depicted in FIG. 6.

Technical benefits include a microwave device and techniques for operating the microwave device. The capability to generate squeezed states of the reflected microwave field at certain frequencies set by the eigenmodes of the microwave device and the frequency of the applied pump tone, which can either coincide with the resonance frequency of the desired squeezed mode or with twice that frequency. This capability is lacking in state-of-the-art Josephson parametric amplifiers (JPAs) because they are in general designed to have a single eigenmode. Also, technical benefits include a microwave resonator that is formed of a finite-length left-handed transmission line which can be engineered to have a high density of modes at the frequency range of interest (i.e., 3-20 GHz) (compared to resonators made of right-handed transmission lines or lumped elements) and which strongly couples to the JJ/DC-SQUID (i.e., the dispersive non-linear medium). As a result of this multimode property, the microwave device can be used to generate on-demand squeezed states of the microwave field at different frequencies (corresponding to its resonance frequencies). This can be achieved by applying a pump drive at the desired resonance frequency (or at twice the resonance frequency in the case of flux-pumping). As further technical benefits and advantages, the microwave device can generate on-demand squeezed states of the microwave field at different frequencies using the same microwave device without the need to tune the resonance frequency of the device using magnetic flux.

The term "about" and variations thereof are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A microwave device comprising:
    a left-handed resonator including at least one unit cell; and
    a non-linear dispersive medium connected to the left-handed resonator, such that one end of the left-handed resonator is connected to the non-linear dispersive medium and an opposite end of the left-handed resonator is connected to a port, wherein the left-handed resonator and the non-linear dispersive medium are configured to output a quantum signal in a squeezed state.

2. The microwave device of claim 1, wherein the at least one unit cell is connected to a first conductor and a second conductor.

3. The microwave device of claim 2, wherein the first conductor is connected to a first end of the non-linear dispersive medium and the second conductor is connected to a second end of the non-linear dispersive medium.

4. The microwave device of claim 2, wherein:
    the at least one unit cell includes a capacitor and an inductor connected together at a node of the first conductor; and
    another end of the inductor is connected to the second conductor.

5. The microwave device of claim 1, wherein the left-handed resonator is configured to have multiple resonance modes in a microwave frequency range and the multiple resonance modes are not equally spaced apart in the frequency domain.

6. The microwave device of claim 5, wherein the multiple resonance modes are in the microwave frequency range 4-20 GHz.

7. The microwave device of claim 1, wherein the non-linear dispersive medium is a Josephson junction.

8. The microwave device of claim 1, wherein the non-linear dispersive medium is an array of Josephson junctions.

9. The microwave device of claim 1, wherein the non-linear dispersive medium is a DC-SQUID.

10. The microwave device of claim 1, wherein the non-linear dispersive medium is an array of DC-SQUIDs.

11. A method of forming a microwave device, the method comprising:
    providing a left-handed resonator including at least one unit cell; and
    providing a non-linear dispersive medium connected to the left-handed resonator, such that one end of the left-handed resonator is connected to the non-linear dispersive medium and an opposite end of the left-handed resonator is connected to a port, wherein the left-handed resonator and the non-linear dispersive medium are configured to output a quantum signal in a squeezed state.

12. The method of claim 11, wherein the at least one unit cell is connected to a first conductor and a second conductor.

13. The method of claim 12, wherein the first conductor is connected to a first end of the non-linear dispersive medium and the second conductor is connected to a second end of the non-linear dispersive medium.

14. The method of claim 12, wherein the at least one unit cell includes a capacitor and an inductor connected together at a node of the first conductor; and wherein another end of the inductor is connected to the second conductor.

15. The method of claim 11, wherein the left-handed resonator is configured to have multiple resonance modes in a microwave frequency range and the multiple resonance modes are not equally spaced apart in the frequency domain.

16. The method of claim 15, wherein the multiple resonance modes are in the microwave frequency range 4-20 GHz.

17. The method of claim 11, wherein the non-linear dispersive medium is a Josephson junction.

18. The method of claim 11, wherein the non-linear dispersive medium is an array of Josephson junctions.

19. The method of claim 11, wherein the non-linear dispersive medium is a DC-SQUID.

20. The method of claim 11, wherein the non-linear dispersive medium is an array of DC-SQUIDs.

21. A method for generating squeezed states using a microwave device, the method comprising:

receiving, by the microwave device having a left-handed resonator with multiple resonance modes, a pump signal and a quantum signal, the pump signal and the quantum signal being at a first one of the multiple resonance modes; and outputting, by the microwave device, a reflected quantum signal in a squeezed state.

22. The method of claim 21 further comprising:

receiving, by the microwave device, the pump signal and the quantum signal at a second one of the multiple resonance modes without needing to tune any of the multiple resonance modes of the left-handed resonator; and outputting the reflected quantum signal at the squeezed state.

23. The method of claim 21 further comprising receiving, by a non-linear dispersive medium, magnetic flux in order to shift the multiple resonance modes of the left-handed resonator.

24. A method for generating squeezed states using a microwave device, the method comprising:

receiving, by the microwave device having a left-handed resonator with multiple resonance modes, a pump signal and a quantum signal, the quantum signal being at a first one of the multiple resonance modes and the pump signal being at twice the first one of the multiple resonance modes; and outputting, by the microwave device, a reflected quantum signal in a squeezed state.

25. The method of claim 24, wherein the pump signal is input through a flux line and the quantum signal is input through a port connected to the microwave device.

* * * * *